(12) United States Patent
Zhu et al.

(10) Patent No.: US 12,068,361 B2
(45) Date of Patent: Aug. 20, 2024

(54) SEMICONDUCTOR STRUCTURE WITH STACKED CAPACITORS

(71) Applicant: CHANGXIN MEMORY TECHNOLOGIES, INC., Hefei (CN)

(72) Inventors: BingYu Zhu, Hefei (CN); Hai-Han Hung, Hefei (CN); Yin-Kuei Yu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 245 days.

(21) Appl. No.: 17/401,523

(22) Filed: Aug. 13, 2021

(65) Prior Publication Data

US 2022/0085149 A1    Mar. 17, 2022

Related U.S. Application Data

(63) Continuation of application No. PCT/CN2021/100905, filed on Jun. 18, 2021.

(30) Foreign Application Priority Data

Sep. 14, 2020    (CN) .......................... 202010959932.4

(51) Int. Cl.
  *H10B 12/00*    (2023.01)
  *H01L 27/08*    (2006.01)
  *H01L 49/02*    (2006.01)

(52) U.S. Cl.
  CPC .......... *H01L 28/82* (2013.01); *H01L 27/0805* (2013.01); *H01L 28/91* (2013.01);
  (Continued)

(58) Field of Classification Search
  CPC ..... H01L 27/0805; H01L 28/82; H01L 28/91; H10B 12/315
  See application file for complete search history.

(56) References Cited

U.S. PATENT DOCUMENTS

| 6,873,002 B2 | 3/2005 | Nishikawa |
| 7,381,614 B2 | 6/2008 | Nishikawa |

(Continued)

FOREIGN PATENT DOCUMENTS

| CN | 101656254 A | 2/2010 |
| CN | 102117809 A | 7/2011 |

(Continued)

*Primary Examiner* — Herve-Louis Y Assouman
*Assistant Examiner* — Christopher M Roland
(74) *Attorney, Agent, or Firm* — Kilpatrick Townsend & Stockton LLP

(57) ABSTRACT

Provided are a semiconductor structure and a method for preparing the same. The method for preparing a semiconductor structure includes: a substrate is provided; a stacked structure is formed on the substrate; a first capacitor having a first bottom electrode, a first dielectric layer and a first top electrode is formed in the stacked structure, in which the first bottom electrode is of a columnar structure; and a second capacitor having a second bottom electrode, a second dielectric layer and a second top electrode is formed on the first capacitor, in which the second bottom electrode is of a concave structure. The second dielectric layer is formed between the second bottom electrode and the second top electrode, and the second dielectric layer is further formed between the second bottom electrodes of adjacent second capacitors.

7 Claims, 22 Drawing Sheets

(52) U.S. Cl.
CPC ............. *H10B 12/01* (2023.02); *H10B 12/02* (2023.02); *H10B 12/315* (2023.02)

(56) References Cited

U.S. PATENT DOCUMENTS

| | | | |
|---|---|---|---|
| 10,290,422 | B1 | 5/2019 | Wang et al. |
| 2004/0004240 | A1 | 1/2004 | Nishikawa |
| 2005/0127426 | A1 | 6/2005 | Nishikawa |
| 2007/0170487 | A1* | 7/2007 | Heitmann ............... H01L 28/91 |
| | | | 438/399 |
| 2011/0163415 | A1 | 7/2011 | Park |
| 2015/0221718 | A1 | 8/2015 | Rhie |

FOREIGN PATENT DOCUMENTS

| | | | |
|---|---|---|---|
| CN | 110459533 | A | 11/2019 |
| CN | 110504284 | A | 11/2019 |
| CN | 111223843 | A | 6/2020 |

* cited by examiner

SEMICONDUCTOR STRUCTURE WITH STACKED CAPACITORS

CROSS-REFERENCE TO RELATED APPLICATIONS

The present application is a U.S. continuation application of International Application No. PCT/CN2021/100905, filed on Jun. 18, 2021, which claims priority to Chinese Patent Application No. 202010959932.4, filed on Sep. 14, 2020. International Application No. PCT/CN2021/100905 and Chinese Patent Application No. 202010959932.4 are incorporated herein by reference in their entireties.

TECHNICAL FIELD

The disclosure relates to the field of semiconductor manufacturing, and in particular to a semiconductor structure and a method for preparing the same.

BACKGROUND

Along with miniaturizing of a semiconductor size and in order to meet a requirement for DRAM capacitor capacitance, a capacitor structure needs to be made higher and higher. Consequently, the single capacitor structure has a problem of stability and results in more difficult manufacturing technologies, such as etching, cleaning and filling with a high depth-to-width ratio. Therefore, how to obtain a stable capacitor structure and effectively increase the capacitor capacitance at the same time is a problem urgently to be solved.

SUMMARY

According some embodiments, the disclosure provides a method for preparing a semiconductor structure, including the following steps. A substrate is provided. A stacked structure is formed on the substrate. A first capacitor having a first bottom electrode, a first dielectric layer and a first top electrode is formed in the stacked structure, in which the first bottom electrode is of a columnar structure. A second capacitor having a second bottom electrode, a second dielectric layer and a second top electrode is formed on the first capacitor, in which the second bottom electrode is of a concave structure. The second dielectric layer is formed between the second bottom electrode and the second top electrode, and the second dielectric layer is further formed between the second bottom electrodes of adjacent second capacitors.

According some embodiments, the disclosure further provides a semiconductor structure. The semiconductor structure includes: a substrate; a first capacitor located on the substrate, in which the first capacitor includes a first bottom electrode, a first dielectric layer and a first top electrode, the first bottom electrode is of a columnar structure, the first dielectric layer covers the first bottom electrode, and the first top electrode is located on one side of the first dielectric layer away from the first bottom electrode; and a second capacitor, located above the first capacitor, in which the second capacitor includes a second bottom electrode being of a concave structure and electrically connected with the first bottom electrode, a second dielectric layer filling and covering the second bottom electrode, and a second top electrode. The second dielectric layer is located between the second bottom electrode and the second top electrode, and the second dielectric layer is further located between second bottom electrodes of adjacent second capacitors.

REFERENCE NUMERALS

100: Semiconductor Structure;
1: Substrate, 11: Pad;
2: Stacked Structure, 21: First Supporting Layer, 22: Second Supporting Layer, 23: Sacrificial Layer, 24: First Through Hole, 25: Opening;
3: First Capacitor, 31: First Bottom Electrode, 32: First Top Electrode, 33: First Dielectric Layer, 34: Filling Groove, 35: Initial First Bottom Electrode, 36: Initial First Top Electrode, 37: Initial First Dielectric Layer;
4: Second Capacitor, 41: Second Bottom Electrode, 42: Second Top Electrode, 43: Second Dielectric Layer, 44: Filling Layer;
5: Supporting Structure, 51: Third Supporting Layer, 52: Dielectric Layer, 53: Second Through Hole, 54: Third Through Hole;
6: Protecting Layer.

DETAILED DESCRIPTION

A method for preparing a semiconductor structure and a semiconductor structure provided by the disclosure are further illustrated in detail below with reference to the drawings and the embodiments.

The method for preparing a semiconductor structure 100 according to an embodiment of the disclosure is described below with reference to the drawings.

Figure 1:
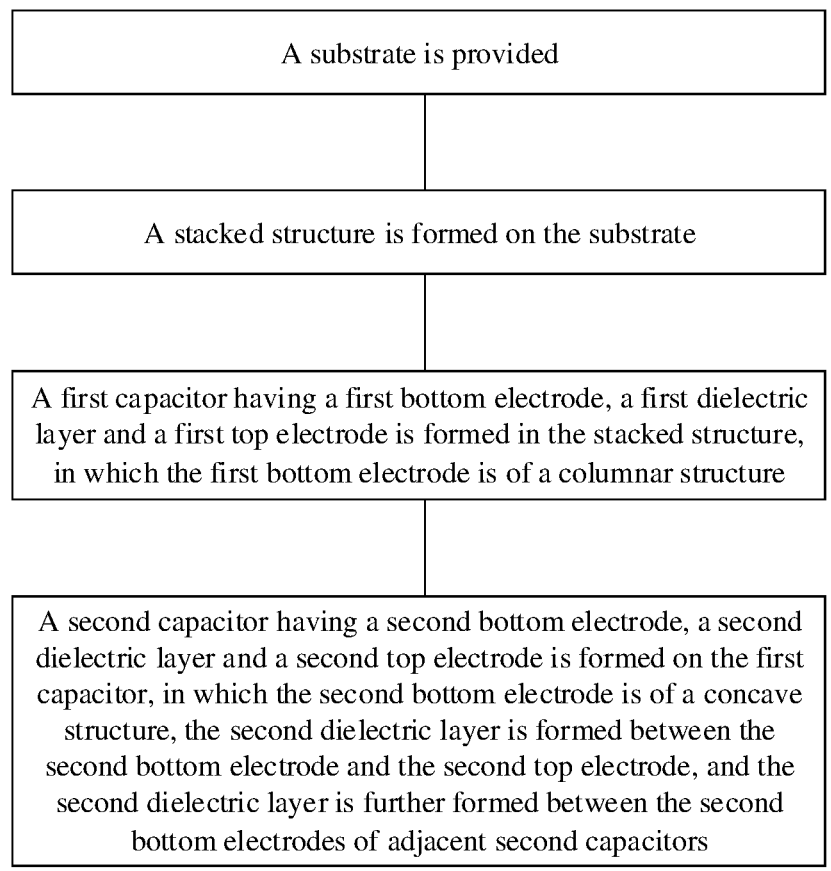
FIG. 1 is a flow diagram of a method for preparing a semiconductor structure according to an embodiment of the disclosure.

As shown in FIG. 1, the method for preparing a semiconductor structure 100 according to an embodiment of the disclosure may include the following steps. A substrate 1 is provided. A stacked structure 2 is formed on the substrate 1. A first capacitor 3 having a first bottom electrode 31, a first dielectric layer 33 and a first top electrode 32 is formed in the stacked structure 2, in which the first bottom electrode 31 is of a columnar structure. A second capacitor 4 having a second bottom electrode 41, a second dielectric layer 43 and a second top electrode 42 is formed on the first capacitor 3, in which the second bottom electrode 41 is of a concave structure. The second dielectric layer 43 is formed between the second bottom electrode 41 and the second top electrode 42, and the second dielectric layer 43 is further formed between second bottom electrodes 41 of the adjacent second capacitors 4.

FIG. 2-FIG. 22 show a sectional view of a technological process of each step of the method for preparing a semiconductor structure 100 according to one specific embodiment of the disclosure.

Figure 2:
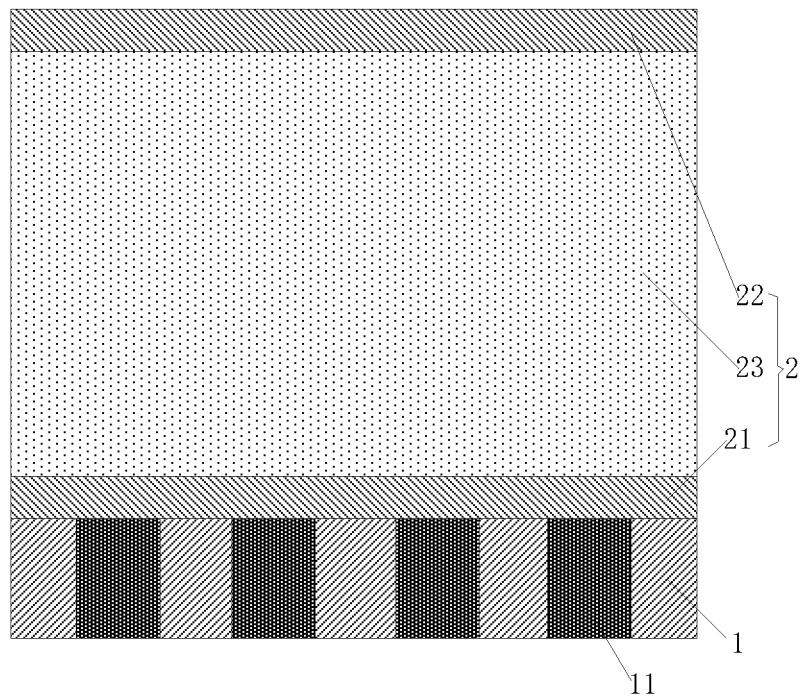
FIG. 2-FIG. 22 are a schematic section diagram of each step of a method for preparing a semiconductor structure according to an embodiment of the disclosure.

As shown in FIG. 2, the substrate 1 is provided, and the substrate 1 may be a Si substrate 1, a Ge substrate 1, a SiGe substrate 1, a Silicon On Insulator (SOI) or Germanium On Insulator (GOI), and the like for supporting a device structure thereon. The substrate 1 may also be a semiconductor base on which a device structure has been formed, for example, a transistor and a conductive plug connected with a source electrode or a drain electrode of the transistor are formed on the substrate 1. The substrate 1 is patterned, and a pad 11 is formed in the substrate 1 so as to be electrically connected with a capacitor device formed above the substrate 1. The pad 11 may be made of a conductive material such as metal tungsten. The pad 11 may be electrically connected with the source electrode or the drain electrode of the transistor in the substrate 1 through the conductive plug.

As shown in FIG. 2, a stacked structure 2 is formed on the substrate 1 and includes a first supporting layer 21, a sacrificial layer 23 and a second supporting layer 22 which are superposed on a surface of the substrate 1 in a direction perpendicular to the substrate 1. The sacrificial layer 23 is formed between the first supporting layer 21 and the second supporting layer 22. The first supporting layer 21 and the second supporting layer 22 may be both made of a nitride material, such as a silicon nitride material. The sacrificial layer 23 may be made of an oxide material, such as a silicon oxide material. The sacrificial layer 23 may also be a sub-stacked structure, such as a sandwiched structure formed from silicon oxide, silicon nitride and silicon oxide, and the like.

As shown in FIG. 3-FIG. 12, the forming the first capacitor 3 having the first bottom electrode 31, the first dielectric layer 33 and the first top electrode 32 in the stacked structure 2, in which the first bottom electrode 31 is of a columnar structure, specifically includes the following steps.

Figure 3:
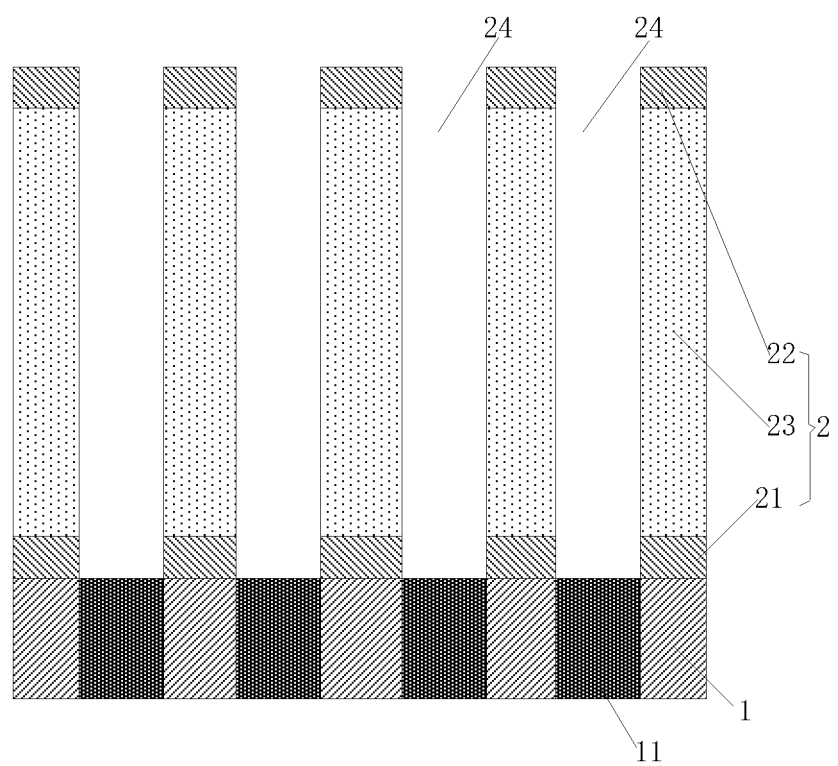

As shown in FIG. 3, a first through hole 24 is formed in the stacked structure 2 so as to expose the pad 11, in which the first through hole 24 is formed above the pad 11 and penetrates through the first supporting layer 21, the sacrificial layer 23 and the second supporting layer 22 in a direction perpendicular to the substrate 1.

Figure 4:
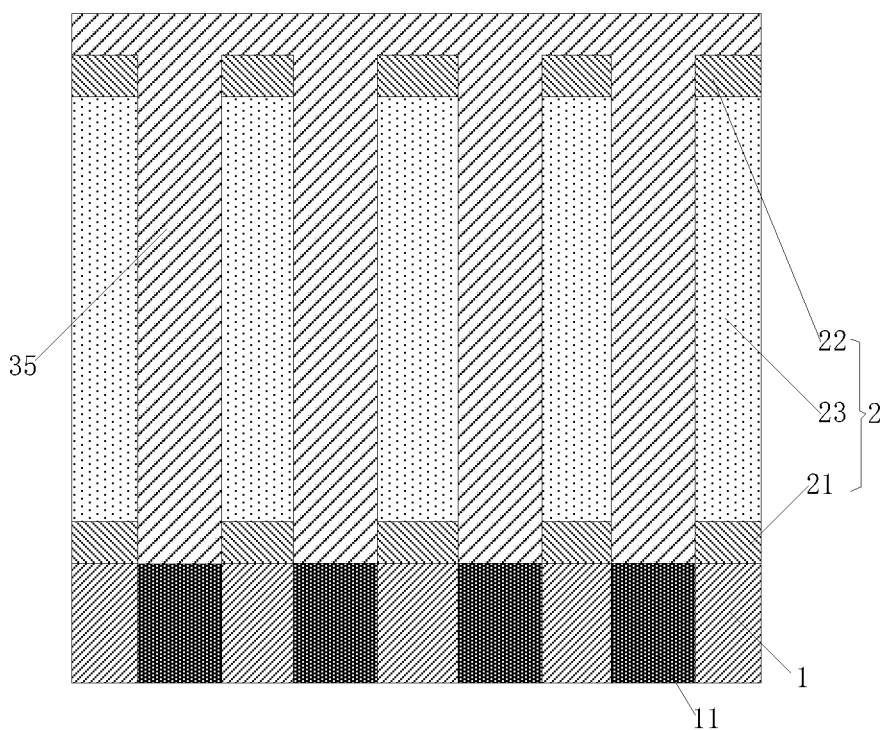
Figure 5:
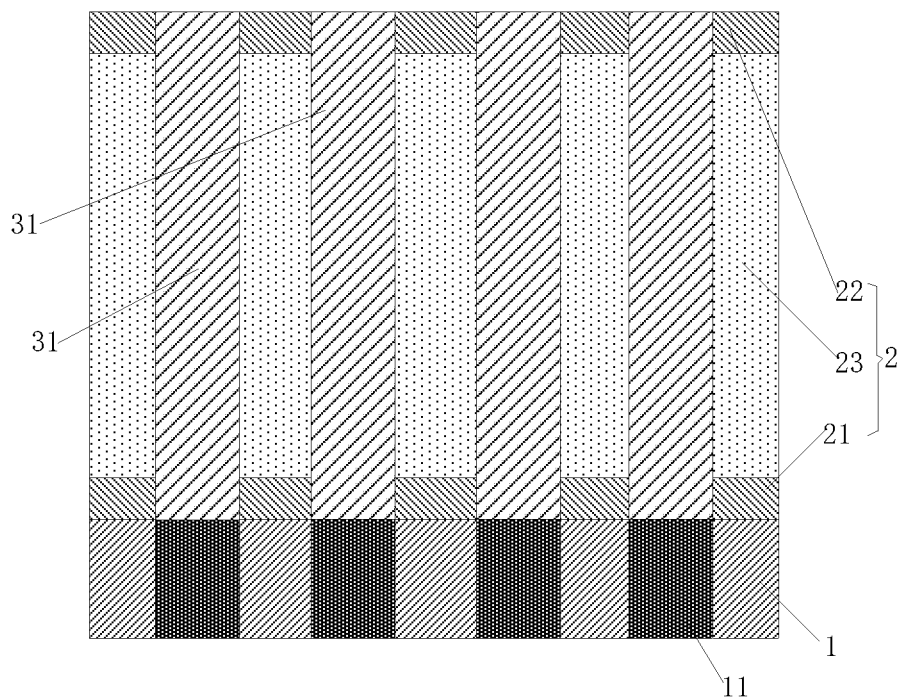

As shown in FIG. 4-FIG. 5, the first bottom electrode 31 filling the first through hole 24 is formed in the first through hole 24, in which the first bottom electrode 31 is electrically connected with the pad 11. Specifically, as shown in FIG. 4, an initial first bottom electrode 35 is formed in the first through hole 24 and on a surface of the second supporting layer 22, the initial first bottom electrode 35 located above the second supporting layer 22 is removed, and the initial first bottom electrode 35 located in the first through hole 24 is retained so as to form the first bottom electrode 31 of the first capacitor 3. The first bottom electrode 31 may be made of a metal material with larger density, such as metal titanium, titanium nitride or metal tungsten.

Figure 6:
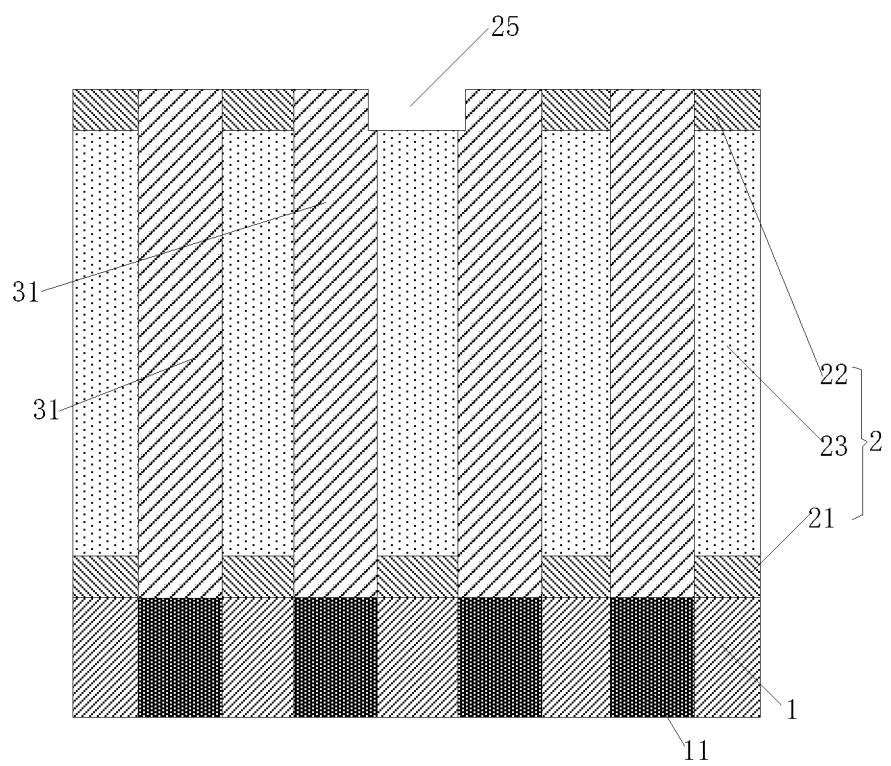
Figure 7:
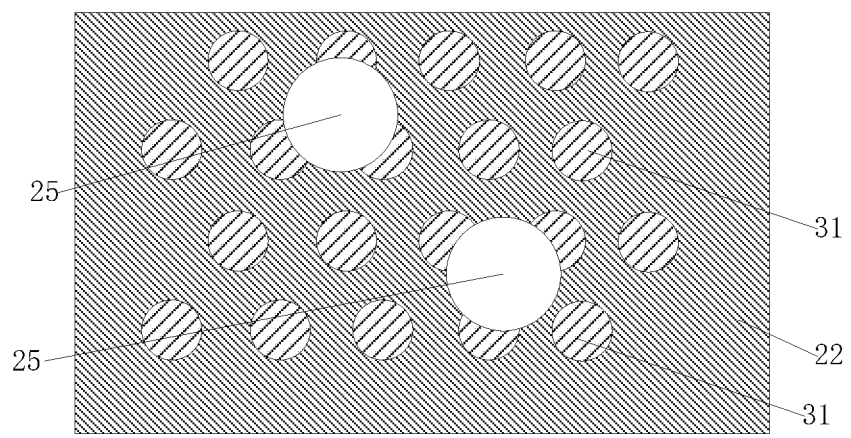

As shown in FIG. 6, an opening 25 is formed so as to expose the sacrificial layer 23. Specifically, the second supporting layer 22 is patterned, part of the second supporting layer 22 is removed so as to form the opening 25 exposing the sacrificial layer 23, thereby conveniently removing the sacrificial layer 23 by etching. As shown in FIG. 7, FIG. 7 is a top view of the semiconductor structure 100 in FIG. 6. The opening 25 is formed among a plurality of adjacent first bottom electrodes 31, the opening 25 may be one or more, and a shape and density of the opening 25 may be selected according to actual needs. In an example as shown in FIG. 7, the opening 25 is formed to be round and formed among three adjacent first bottom electrodes 31.

Figure 8:
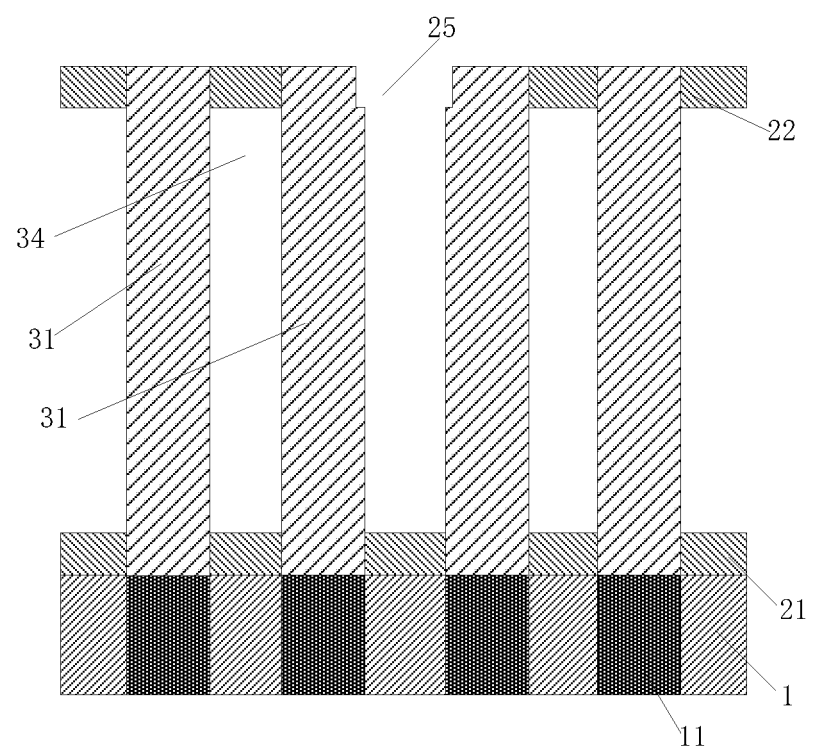

As shown in FIG. 8, the sacrificial layer 23 is removed so as to form a filling groove 34, thereby conveniently forming the first top electrode 32 and the first dielectric layer 33 by filling. Specifically, the sacrificial layer 23 between the first supporting layer 21 and the second supporting layer 22 may be removed through wet etching or dry etching, and an etching solution or etching gas makes contact with the sacrificial layer 23 through the opening 25 so as to etch away the sacrificial layer 23. Further, the selective wet etching may be adopted to remove the sacrificial layer 23 so as to reduce etching damage to the first bottom electrode 31, the first supporting layer 21 and the second supporting layer 22. For example, a hydrofluoric acid solution and the like may be adopted for wet etching to remove the sacrificial layer 23 so as to form the filling groove 34.

Figure 9:
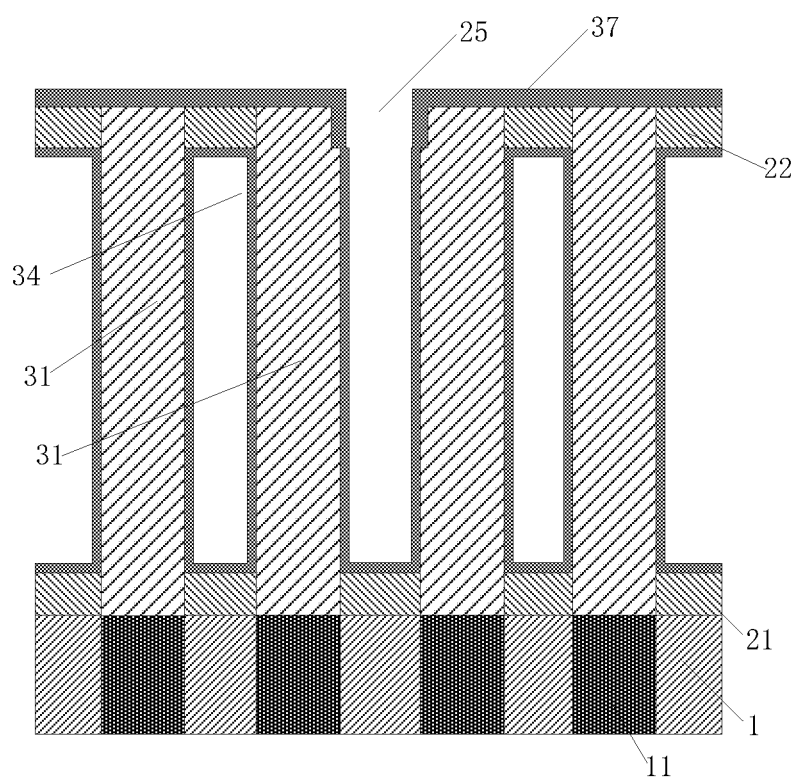
Figure 10:
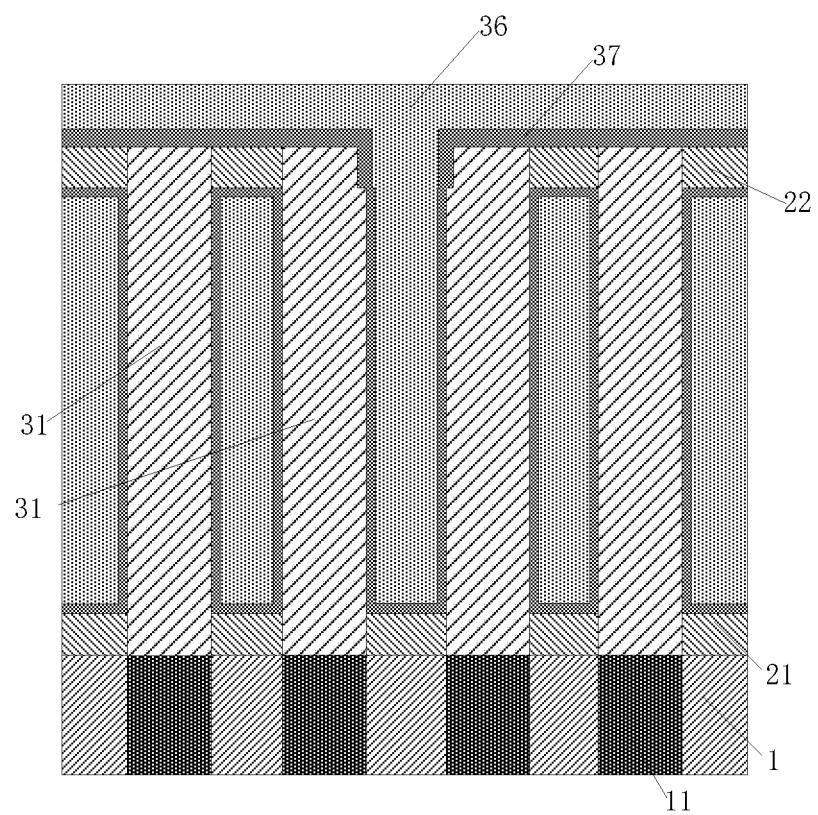

As shown in FIG. 9-FIG. 12, the first dielectric layer 33 and the first top electrode 32 are formed in the filling groove 34 so as to form the first capacitor 3, in which the first dielectric layer 33 is formed between the first bottom electrode 31 and the first top electrode 32. As shown in FIG. 9, an initial first dielectric layer 37 is formed on a surface of the first bottom electrode 31, a surface of the first supporting layer 21 and an inner wall of the filling groove 34, and the initial first dielectric layer 37 covers an inner wall face of the filling groove 34 but not fully fill the filling groove 34. As shown in FIG. 10, an initial first top electrode 36 is formed on a surface of the initial first dielectric layer 37, and the initial first top electrode 36 covers the surface of the initial first dielectric layer 37 and fully fills the filling groove 34.

Figure 11:
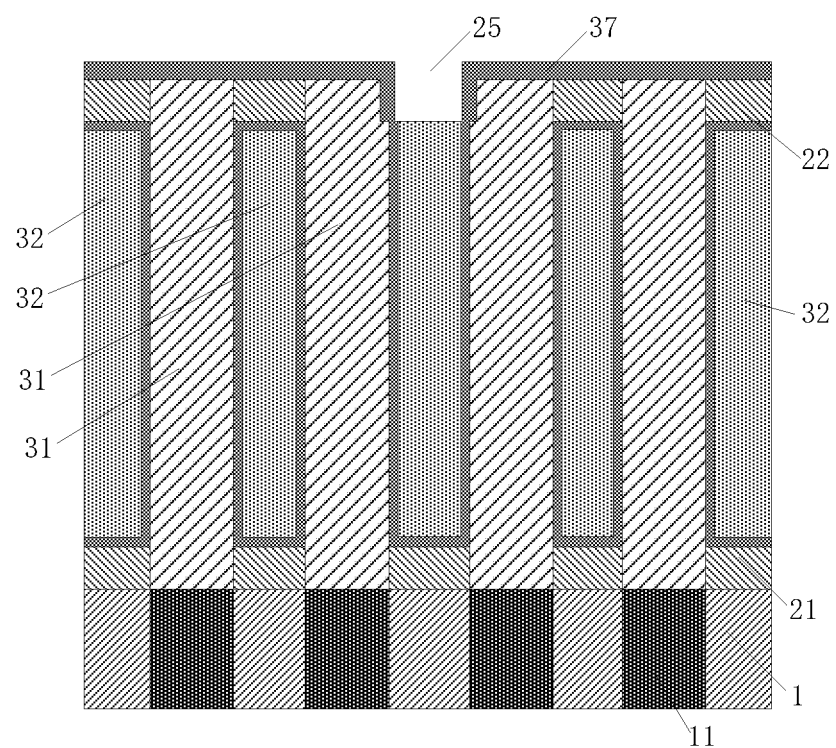
Figure 12:
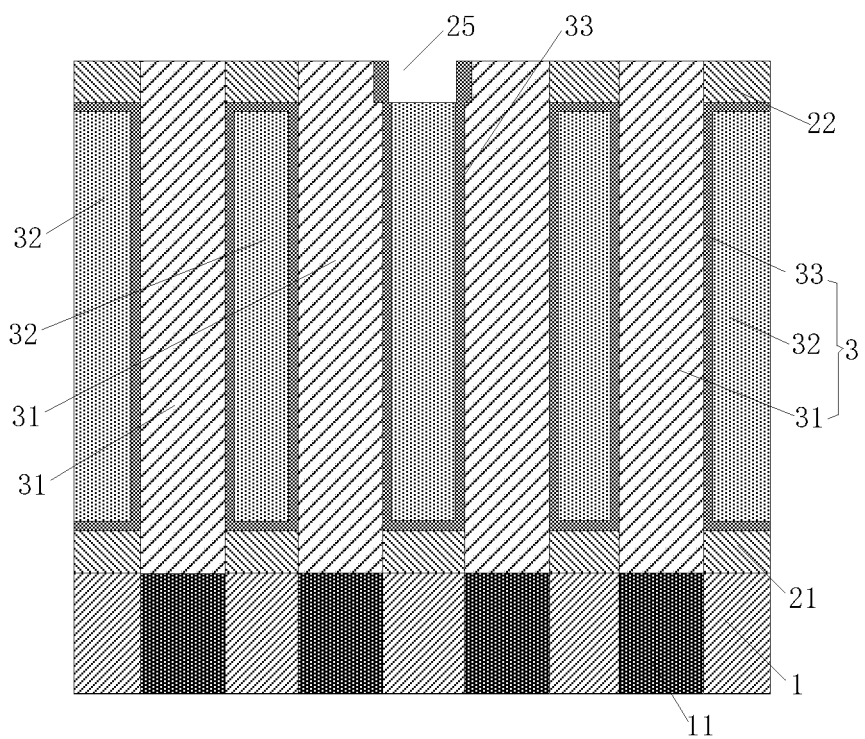

As shown in FIG. 11, the initial first top electrode 36 located above the first bottom electrode 31 is removed. Further, the initial first top electrode 36 located in the opening 25 is removed, and the initial first top electrode 36 located in the filling groove 34 is retained so as to form the first top electrode 32. As shown in FIG. 12, the initial first dielectric layer 37 above the second supporting layer 22 and the first bottom electrode 31 is removed, and the initial first dielectric layer 37 located in the filling groove 34 and the opening 25 is retained so as to form the first dielectric layer 33 of the first capacitor 3. In this way, the first dielectric layer 33 and the first top electrode 32 fully fill the filling groove 34, and the first dielectric layer 33 is located between the first top electrode 32 and the first bottom electrode 31. The first top electrode 32 may be made of a metal material with larger density, such as metal titanium, titanium nitride or metal tungsten.

As shown in FIG. 13-FIG. 21, the second capacitor 4 having the second bottom electrode 41, the second dielectric layer 43 and the second top electrode 42 is formed on the first capacitor 3, and the second bottom electrode 41 is formed to be of the concave structure, thereby effectively increasing a capacitance of the semiconductor structure 100. Moreover, the first bottom electrode 31 in the first capacitor 3 is formed to be of the columnar structure, and the second bottom electrode 41 in the second capacitor 4 is formed to be of the concave structure, thereby greatly reducing a gravity center height in a semiconductor structure 100 making process, and further enhancing stability of the semiconductor structure 100 formed by mixing a columnar-type capacitor with a concave-type capacitor.

As shown in FIG. 13-FIG. 21, the step of forming the second capacitor 4 includes the following operations. A supporting structure 5 is formed on an upper surface of the first capacitor 3, in which part of the supporting structure 5 fills the opening 25. A second through hole 53 exposing the first bottom electrode 31 is formed in the supporting structure 5. The second bottom electrode 41 covering an inner wall of the second through hole 53 is formed in the second through hole 53. The second dielectric layer 43 and the second top electrode 42 are formed on a surface of the second bottom electrode 41 so as to form the second capacitor 4, in which the second dielectric layer 43 is formed between the second bottom electrode 41 and the second top electrode 42.

Figure 13:
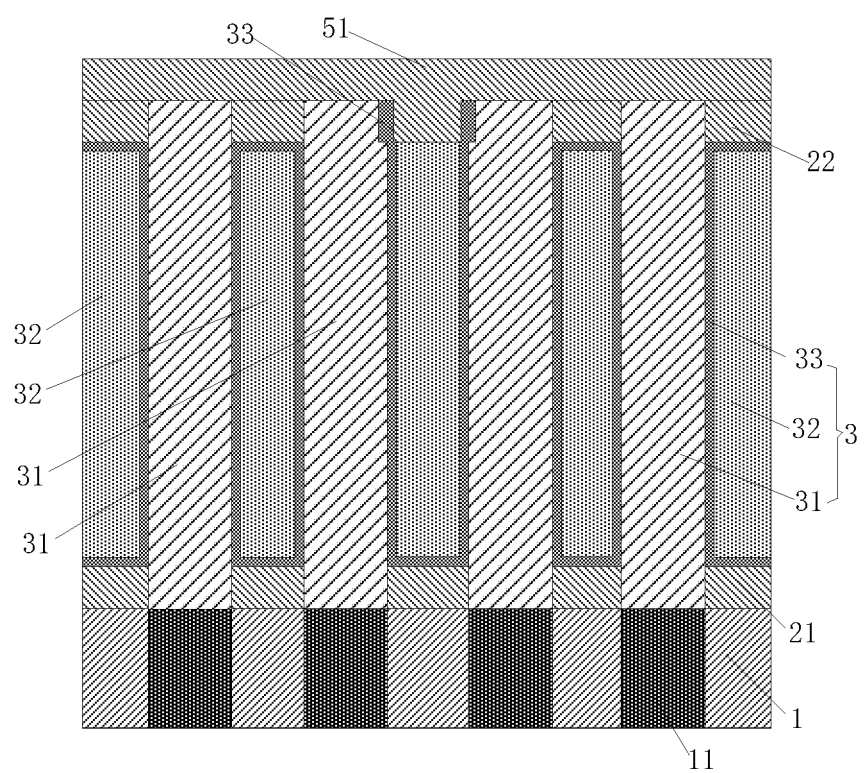
Figure 14:
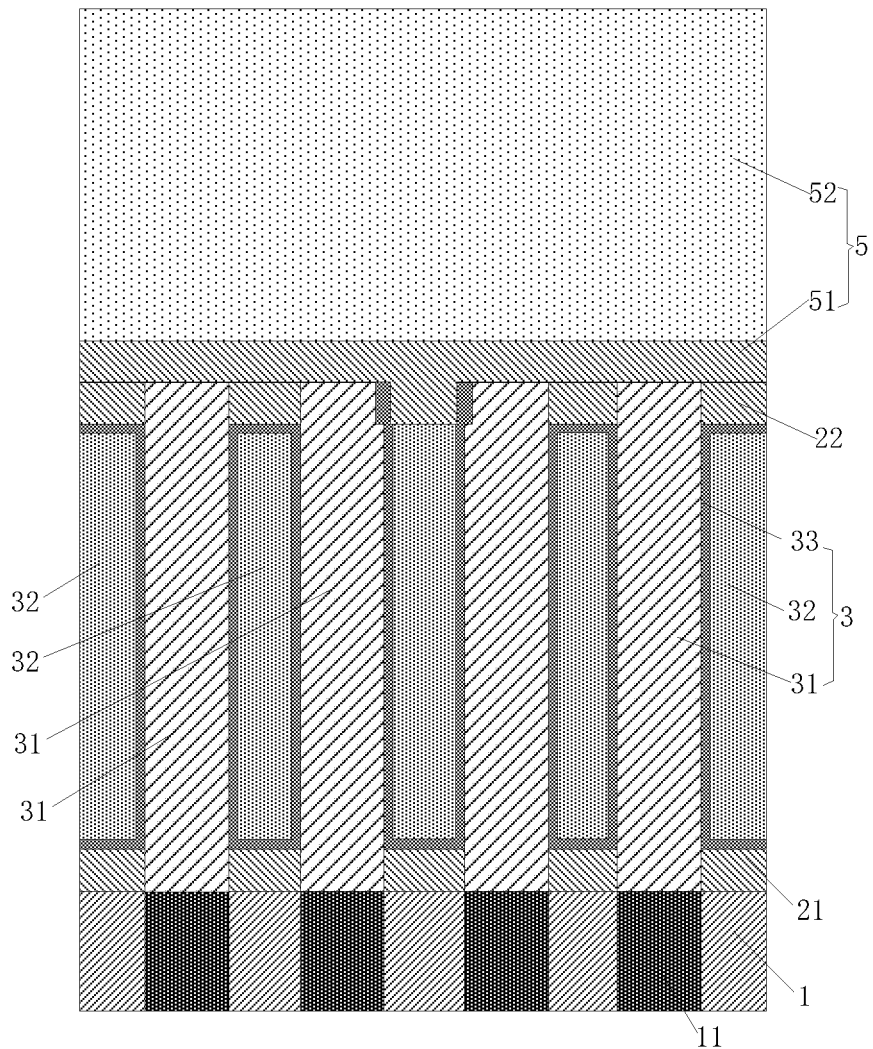

Specifically, the supporting structure 5 may include a third supporting layer 51 and a dielectric layer 52. As shown in FIG. 13-FIG. 14, the step of forming the supporting structure 5 on the upper surface of the first capacitor 3, includes the following operations. As shown in FIG. 13, a third supporting layer 51 is formed on the upper surface of the first capacitor 3, in which the third supporting layer 51 is formed on the surface of the second supporting layer 22 and the surface of the first bottom electrode 31 and fills the opening 25. As shown in FIG. 14, the dielectric layer 52 is formed on an upper surface of the third supporting layer 51, in which a thickness of the dielectric layer 52 is larger than that of the third supporting layer 51. The third supporting layer 51 and the second supporting layer 22 may adopt the same material. For example, both the third supporting layer 51 and the second supporting layer 22 are formed to be a silicon nitride layer, and the dielectric layer 52 may be a low-K dielectric material layer. For example, the dielectric layer 52 may be silicon oxide doped with a low-polarity atom or group such as fluorine or hydroxyl, thereby reducing a coupling effect between the subsequently-formed second bottom electrodes 42.

Figure 15:
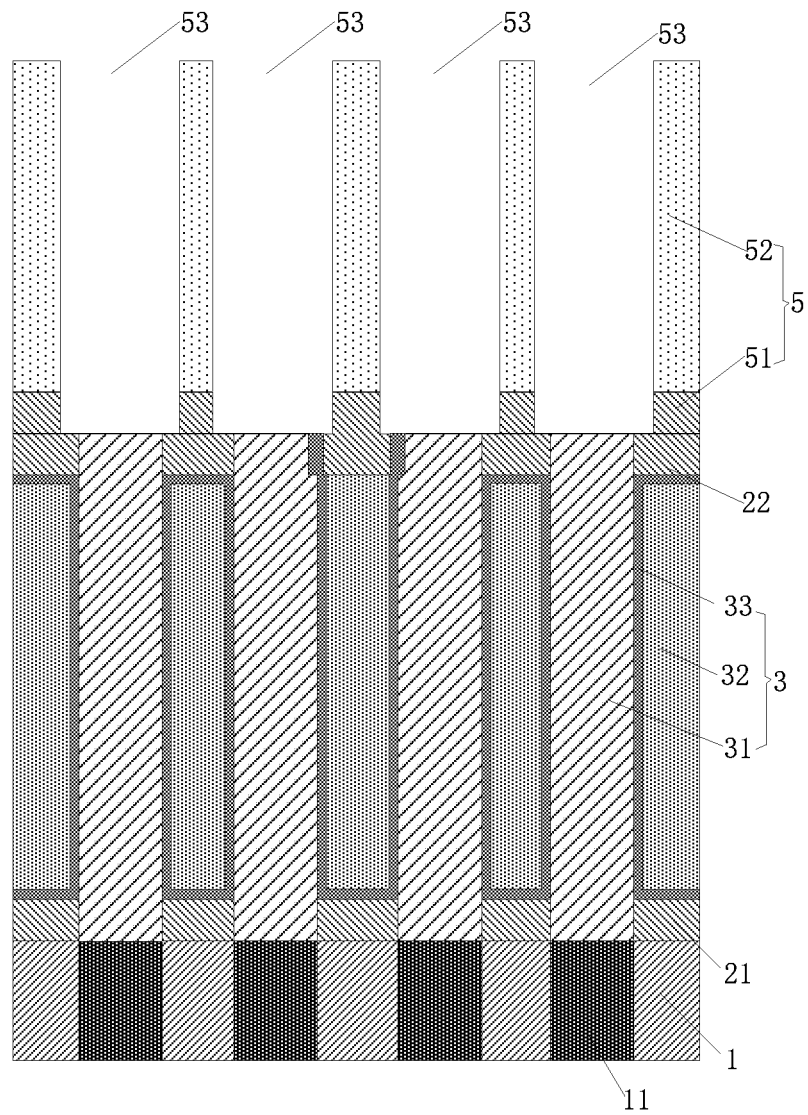

As shown in FIG. 15, the second through hole 53 exposing the first bottom electrode 31 is formed in the supporting structure 5, in which the second through hole 53 penetrates through the third supporting layer 51 and the dielectric layer 52 in a direction perpendicular to the supporting structure 5 and corresponds to the first bottom electrode 31 in position, so as to expose the first bottom electrode 31. Further, a cross section area of the second through hole 53 is not smaller than a cross section area of the upper surface of the first bottom electrode 31. As shown in FIG. 15, a width of the second through hole 53 is larger than a width of the surface of the first bottom electrode 31, that is, an outer contour of a cross section of the second through hole 53 is located on an outer side of an outer contour of a cross section of the first bottom electrode 31, so that the subsequently-formed second bottom electrode 41 and the first bottom electrode 31 have a larger contact area and an aligned technological window. Further, a central axis of the second through hole 53 is coincided with a central axis of the first bottom electrode 31. In this way, the first bottom electrode 31 may be completely exposed so as to be electrically connected with the subsequently-formed second capacitor 4, and the second bottom electrode 41 is formed between the first bottom electrode 31 and the second dielectric layer 43, thereby facilitating contact and series connection between the first bottom electrode 31 and the second bottom electrode 41 as well.

Figure 16:
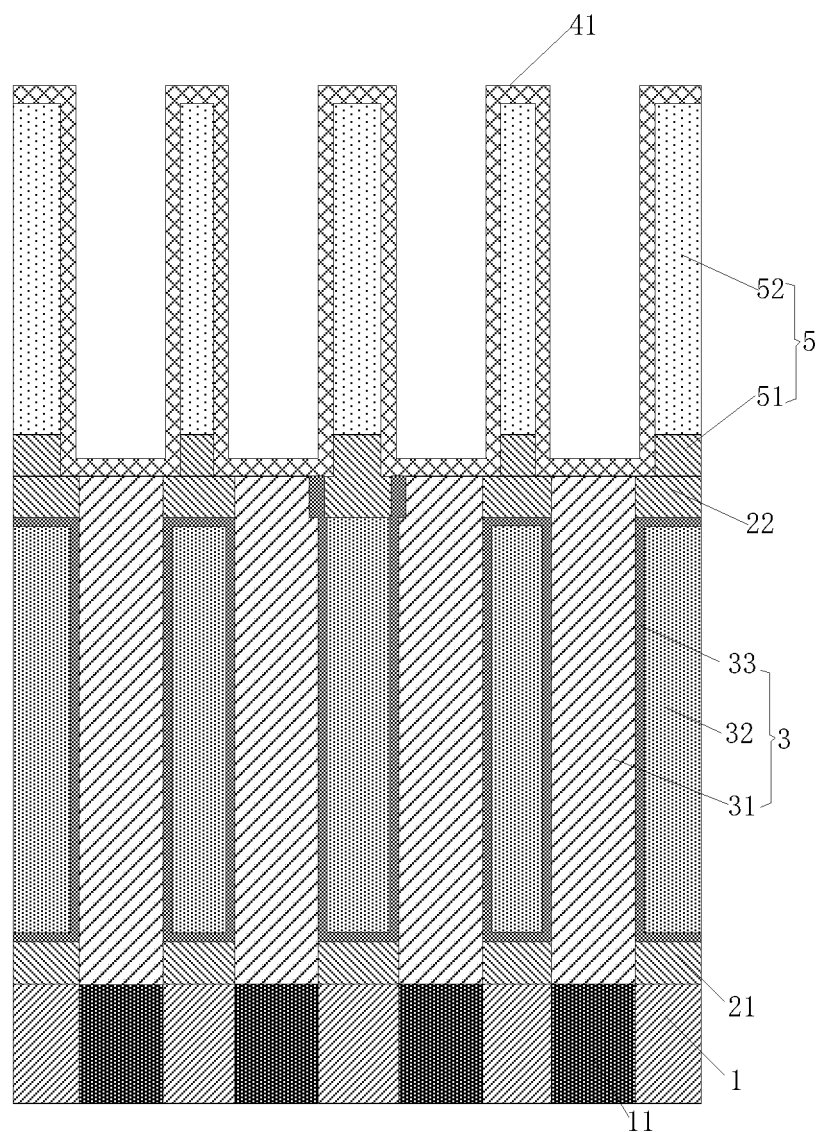

As shown in FIG. 16, the second bottom electrode 41 covering the inner wall of the second through hole 53 is formed in the second through hole 53. In some embodiments of the disclosure, the second bottom electrode 41 may be disposed in the second through hole 53 and on the dielectric layer 52. That is, the second bottom electrode 41 may cover the inner wall face of the second through hole 53 and an upper surface of the dielectric layer 52, the second dielectric layer 43 is formed on the surface of the second bottom electrode 41, and the second top electrode 42 is formed on the surface of the second dielectric layer 43 and fills the second through hole 53.

In some other embodiments of the disclosure, the second bottom electrode 41 is formed on the inner wall of the second through hole 53 and covers the inner wall face of the second through hole 53, and the second bottom electrode 41 does not cover the upper surface of the dielectric layer 52. The dielectric layer 52 is etched so as to form a third through hole 54, in which the second dielectric layer 43 is formed on the surface of the dielectric layer 52 and the surface of the second bottom electrode 41 and fills the third through hole 54, thereby further increasing an area of the dielectric layers of the semiconductor structure 100 so as to increase the capacitance.

Figure 17:
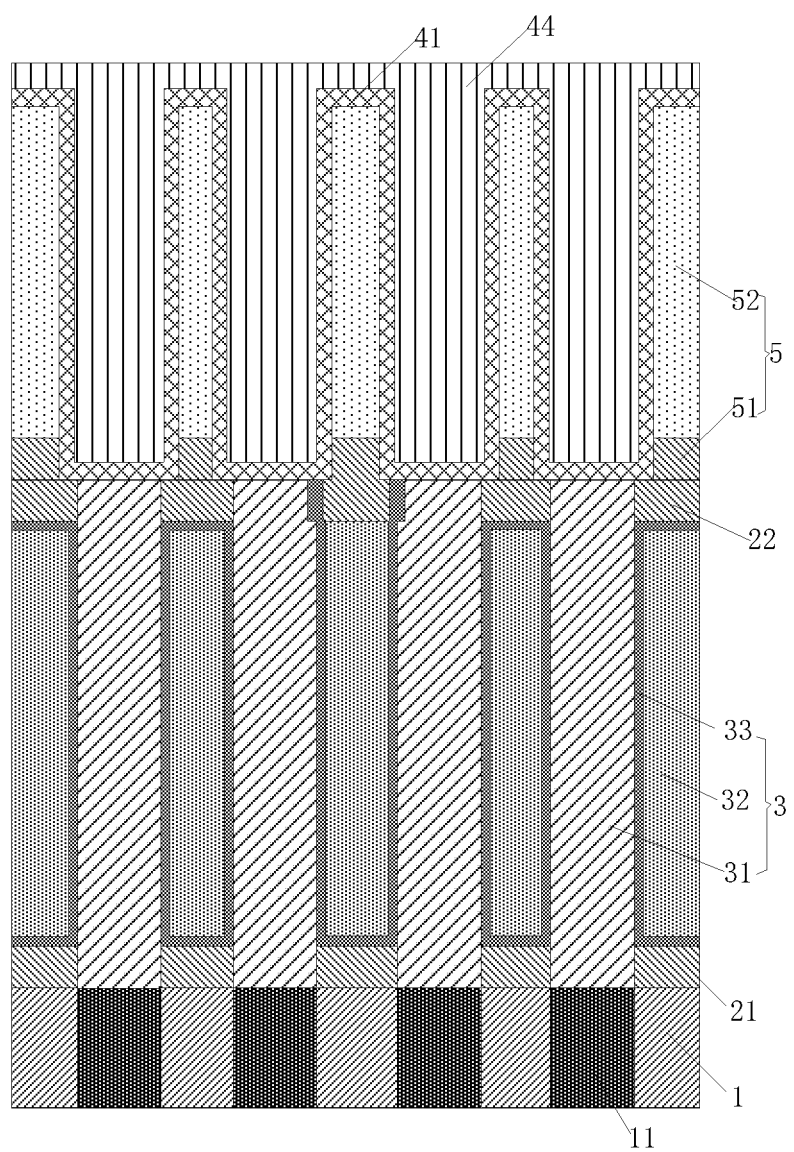

The specific steps are as following. As shown in FIG. 16, the second bottom electrode 41 is formed on the surface of the second through hole 53 and the surface of the third supporting layer 51, in which the second bottom electrode 41 does not fully fill the second through hole 53. As shown in FIG. 17, a filling layer 44 is formed on the surface of the second bottom electrode 41, in which the filling layer 44 fully fills the second through hole 53. The filling layer 44 is patterned. The part of the filling layer 44 located above the supporting structure 5 is removed, and the part of the second bottom electrode 41 located above the dielectric layer 52 is exposed. The filling layer 44 may serve as a mask layer for removing the second bottom electrode 41 above the dielectric layer 52, and also plays a role in supporting the second bottom electrode 41 to prevent it from collapsing when the part of the dielectric layer 52 between the second bottom electrodes 41 of the adjacent second capacitors 4 is removed. Specifically, after the filling layer 44 located above the dielectric layer 52 is removed, the filling layer 44 located in the second through hole 53 may be formed to serve as a mask layer so as to remove the second bottom electrode 41 located above the dielectric layer 52 by etching, and retain the second bottom electrode 41 located in the second through hole 53. The filling layer 44 may be materials, such as Spin-on-Carbon (SOC) and Spin-on-Glass (SOD), which easily fill a groove with a high depth-to-width ratio.

Figure 18:
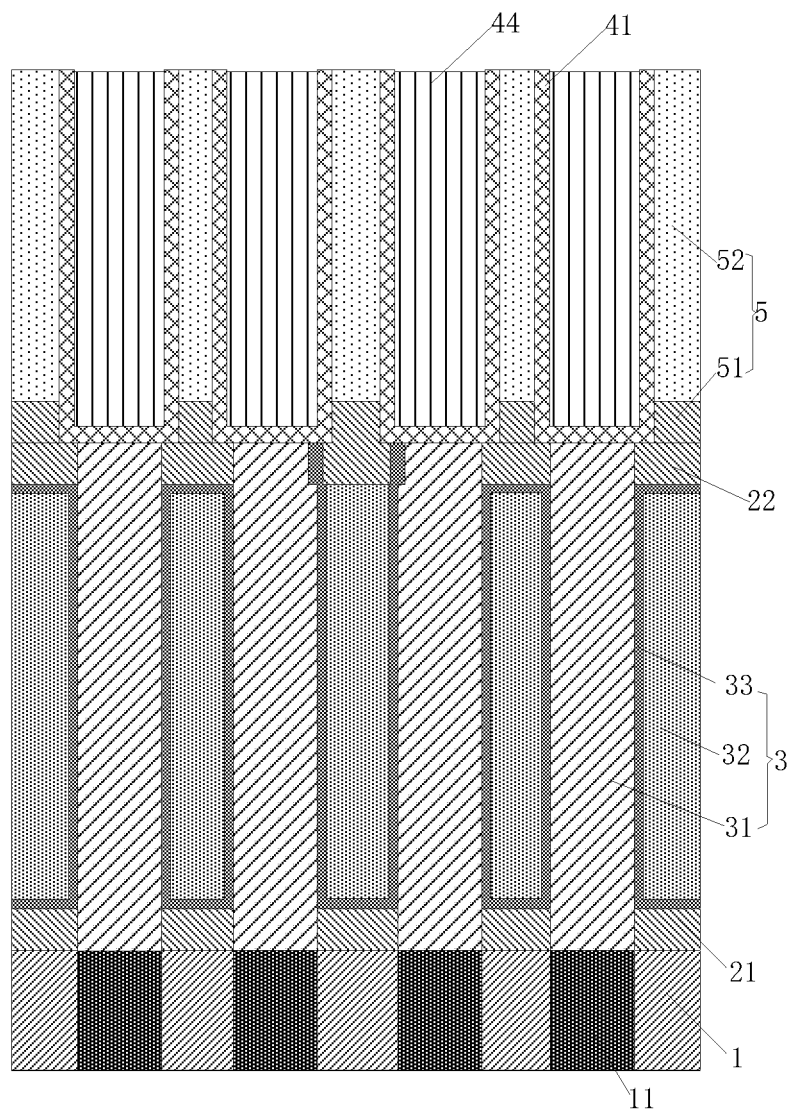
Figure 19:
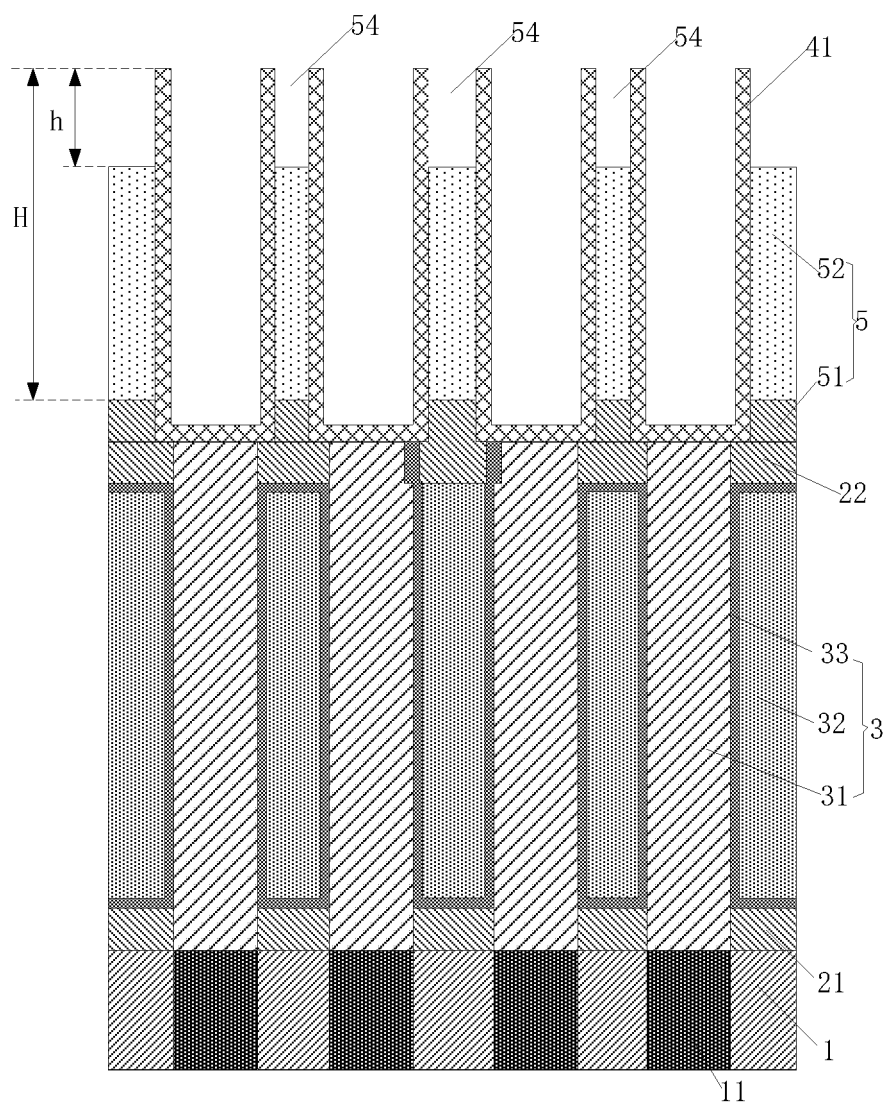

As shown in FIG. 18, after the part of the second bottom electrode 41 located above the supporting structure 5 is removed, the supporting structure 5 is exposed. As shown in FIG. 19, the part of the supporting structure 5 is removed, that is, the part of the dielectric layer 52 is removed so as to form the third through hole 54 between the second bottom electrodes 41. The part of the second bottom electrode 41 may be exposed through the third through hole 54, so that both sides of the part of the second bottom electrode 41 are exposed. Further, after the dielectric layer 52 is exposed, the remaining filling layer 44 may be removed so as to form the second dielectric layer 43 on the surface of the second bottom electrode 41. For example, the dry etching or wet etching may be adopted to remove the filling layer 44 located in the second through hole 53 so as to facilitate subsequent forming of the second dielectric layer 43 and the second top electrode 42.

The part of the dielectric layer 52 may be removed through a wet etching technology or a dry etching technology and the like to form the third through hole 54, and a thickness of the part of the dielectric layer 52 which is removed is not larger than 30% of a total thickness of the dielectric layer 52. For example, as shown in FIG. 19, the thickness of the part of the dielectric layer 52 which is removed is h, the total thickness of the dielectric layer 52 is H, and h≤30% H, thereby avoiding the risk that the thickness of the remaining dielectric layer 52 is too small and collapse occurs.

Figure 20:
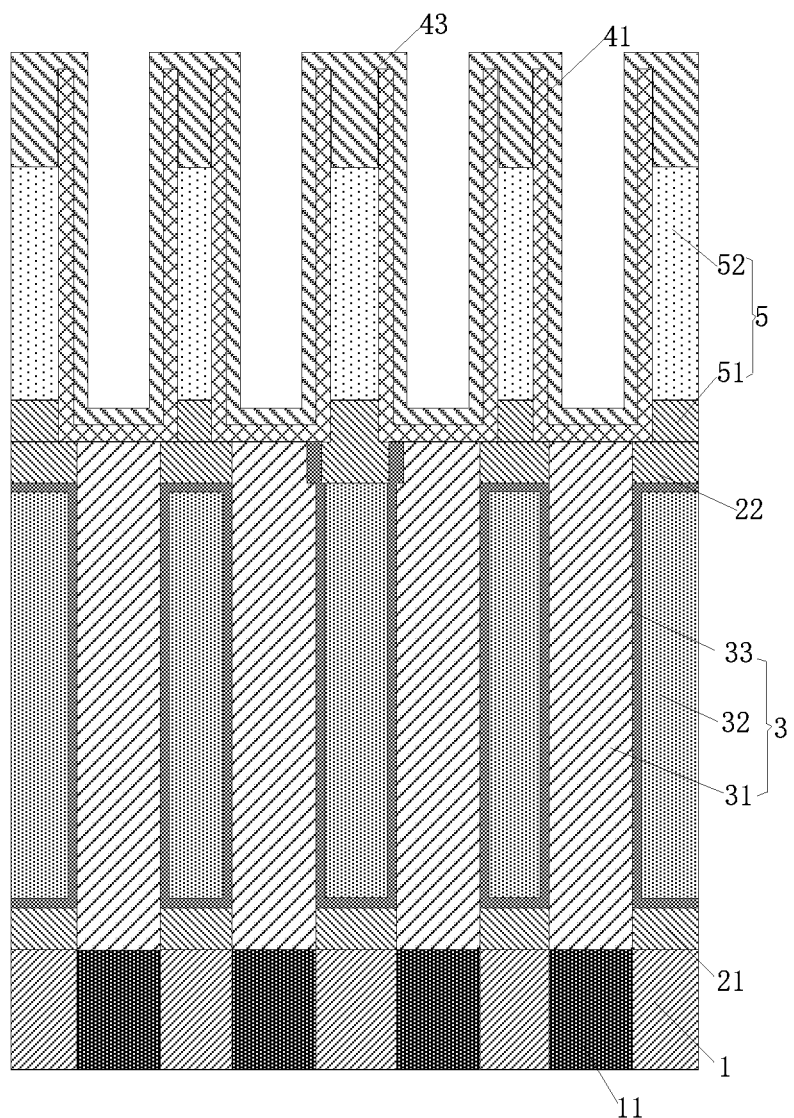

As shown in FIG. 20, the second dielectric layer 43 is formed on the surface of the second bottom electrode 41 and fills the third through hole 54, therefore, part of the second dielectric layer 43 is formed on both sides of part of the second bottom electrode 41, thereby increasing the area of the second dielectric layer 43, and further increasing the capacitance of the semiconductor structure 100.

In other embodiments, the second dielectric layer 43 is formed on the surface of the second bottom electrode 41 but does not fully fill the third through hole 54. The second top electrode 42 fully fills the third through hole 54 not fully filled, that is, the second top electrode 42 is further formed between the second bottom electrodes 41 of the adjacent second capacitors 4 and the supporting structure 5.

Figure 21:
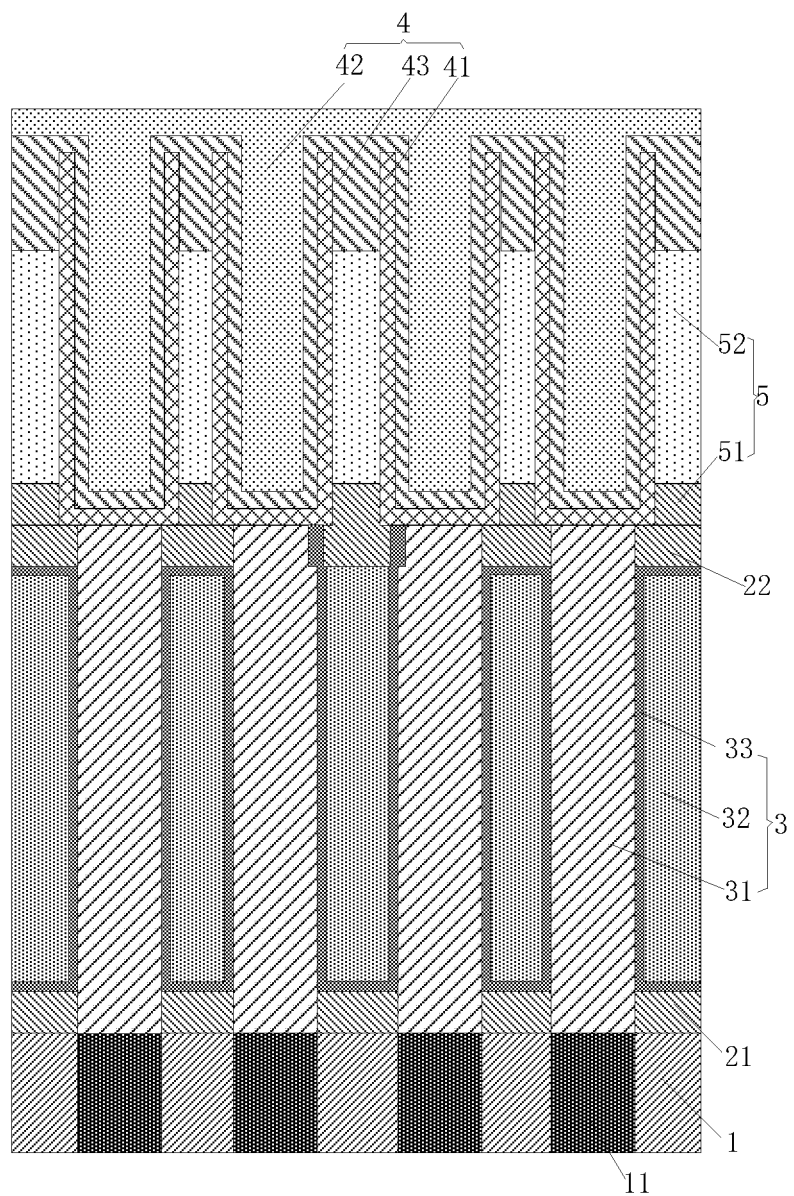

As shown in FIG. 21, the second top electrode 42 is formed on the surface of the second dielectric layer 43, and the second top electrode 42 covers the surface of the second dielectric layer 43. The second top electrode 42 may be a semiconductor material, such as polycrystalline silicon, with a material having a density smaller than that of the first bottom electrode 31. Thus a gravity center of the formed semiconductor structure 100 may be further lowered, so that the formed semiconductor structure 100 is more stable, and is prevented from reducing of a yield due to collapsing in subsequent making technologies such as a spin coating technology and a cleaning technology.

Figure 22:
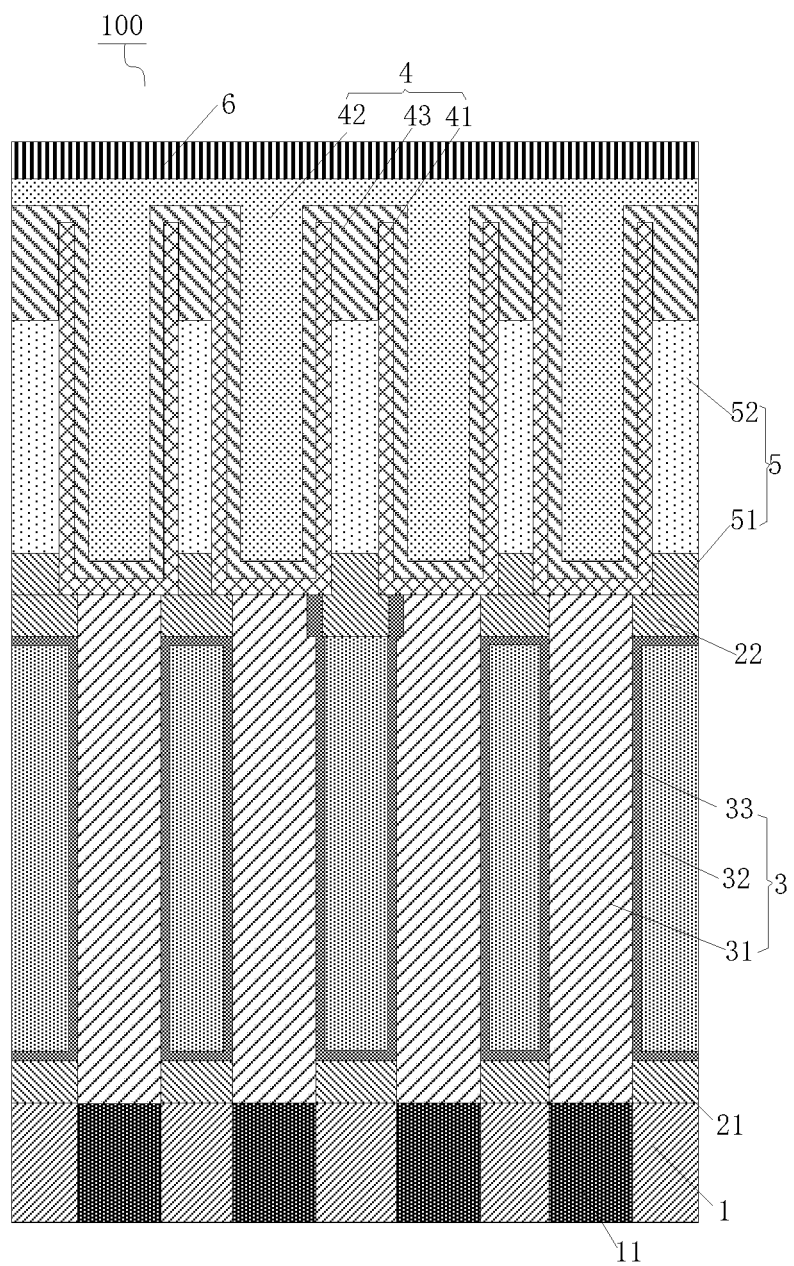

As shown in FIG. 22, a protecting layer 6 is formed on the surface of the second top electrode 42 so as to avoid exposing of the second capacitor 4. The semiconductor structure 100 may further include a first wire and a second wire, in which the first wire is disposed on a side portion of the semiconductor structure 100 so as to be electrically connected with the first top electrode 32, and the second wire may penetrate through the protecting layer 6 to be electrically connected with the second top electrode 42. The first top electrode 32 and the second top electrode 42 are connected to a same electric potential.

The semiconductor structure 100 according to an embodiment of the disclosure is described below with reference to drawings. The semiconductor structure 100 may be formed by adopting the method for preparing a semiconductor structure 100 according to the above embodiment.

The semiconductor structure 100 provided by the embodiment of the disclosure may include a substrate 1, and a first capacitor 3 and a second capacitor 4 located on the substrate 1.

Specifically, as shown in FIG. 21 and FIG. 22, the first capacitor 3 is located above the substrate 1. The first capacitor 3 includes a first bottom electrode 31, a first dielectric layer 33 and a first top electrode 32, in which the first bottom electrode 31 is of a columnar structure. The first dielectric layer 33 covers the first bottom electrode 31, and the first top electrode 32 is located on one surface of the first dielectric layer 33 away from the first bottom electrode 31.

The second capacitor 4 is located above the first capacitor 3. The second capacitor 4 includes a second bottom electrode 41 being of a concave structure and electrically connected with the first bottom electrode 31, a second dielectric layer 43 filling and covering the second bottom electrode 41, and a second top electrode 42. The second dielectric layer 43 is located between the second bottom electrode 41 and the second top electrode 42, and the second dielectric layer 43 is further located between the second bottom electrodes 41 of the adjacent second capacitors 4.

As shown in FIG. 21, the second dielectric layer 43 is further formed between the second bottom electrodes 41 of the adjacent second capacitors 4. Specifically, a supporting structure 5 is formed on a lower region between the second bottom electrodes 41 of the adjacent second capacitors 4, and the second dielectric layer 43 is formed on an upper region between the second bottom electrodes 41 of the adjacent second capacitors 4 so as to increase the second capacitor 4.

In the embodiment, a bottom width of the second bottom electrode 41 is larger than a top width of the first bottom electrode 31.

In other embodiments, a central axis of the first bottom electrode 31 is aligned with a central axis of the second bottom electrode 41 so that the second bottom electrode 41 may make full contact with the first bottom electrode 31, so as to ensure an electrical-connection effect of the first bottom electrode 31 and the second bottom electrode 41.

In the embodiment, the semiconductor structure 100 may further include a supporting structure 5. The supporting structure 5 is formed among the first dielectric layer 33, the first top electrode 32 and the second bottom electrode 41, and at least partially extends into a space between the adjacent second capacitors 4. The second capacitor 4 may be supported through the supporting structure 5 so as to prevent the second capacitor 4 from collapsing.

In the embodiment, a pad 11 is disposed in the substrate 1, and the first bottom electrode 31 is disposed on the upper surface of the pad 11 and electrically connected with the pad 11.

In the embodiment, a height of the second dielectric layer 43 located between the second bottom electrodes 41 of the adjacent second capacitors 4 is not larger than 30% of a height of the second capacitor 4.

In the embodiment, a density of a material of the first bottom electrode 31 is larger than a density of a material of the second top electrode 42.

In the embodiment, the first bottom electrode 31 and the first top electrode 32 are both made of a metal material, and the second top electrode 42 is made of a semiconductor material.

In the embodiment, the second top electrode 42 is further located between the second bottom electrodes 41 of the adjacent second capacitors 4.

The above mentioned is only a preferred implementation of the disclosure. It should be noted that those ordinarily skilled in the art can further make several improvement and modifications without departing from the principle of the disclosure, and the improvement and modifications shall also be regarded as a protection scope of the disclosure.

The invention claimed is:

1. A semiconductor structure, comprising:
   a substrate;
   a first capacitor located on the substrate, wherein the first capacitor comprises a first bottom electrode, a first dielectric layer and a first top electrode, the first bottom electrode is of a columnar structure, the first dielectric layer covers the first bottom electrode, and the first top electrode is located on one surface of the first dielectric layer away from the first bottom electrode; and
   a second capacitor, located above the first capacitor, wherein the second capacitor comprises a second bottom electrode being of a concave structure and electrically connected with the first bottom electrode, a second dielectric layer filling and covering the second bottom electrode, and a second top electrode;
   wherein the second dielectric layer is located between the second bottom electrode and the second top electrode, and the second dielectric layer is further located between the second bottom electrodes of adjacent second capacitors,
   wherein the semiconductor structure further comprises a first supporting layer, a second supporting layer and a third supporting layer, the first supporting layer is located at a periphery of a bottom of the first bottom electrode, and the second supporting layer is located at a periphery of a top of the first bottom electrode, the third supporting layer is located at a periphery of a bottom of the second bottom electrode, and part of the third supporting layer is disposed in the second supporting layer such that a line extending parallel to a top surface of the substrate intersects both the part of the third supporting layer and the second supporting layer, and wherein the second dielectric layer fully fills a partial space between the second bottom electrodes of the adjacent second capacitors, and the partial space is away from the third supporting layer.

2. The semiconductor structure of claim 1, wherein a bottom width of the second bottom electrode is larger than a top width of the first bottom electrode.

3. The semiconductor structure of claim 1, wherein the part of the third supporting layer is formed among the first dielectric layer, the first top electrode and the second bottom electrode, and at least partially extends into a space between adjacent second bottom electrodes.

4. The semiconductor structure of claim 1, wherein a height of the second dielectric layer located between the second bottom electrodes of the adjacent second capacitors is not larger than 30% of a height of the second capacitor.

5. The semiconductor structure of claim 1, wherein a density of a material of the first bottom electrode is larger than a density of a material of the second top electrode.

6. The semiconductor structure of claim 5, wherein the first bottom electrode and the first top electrode are both made of a metal material, and the second top electrode is made of a semiconductor material.

7. The semiconductor structure of claim 1, wherein the second top electrode is further located between the second bottom electrodes of the adjacent second capacitors.

* * * * *